US010672922B2

(12) United States Patent
Mu et al.

(10) Patent No.: US 10,672,922 B2
(45) Date of Patent: Jun. 2, 2020

(54) SOLAR CELLS WITH COPPER ELECTRODES

(71) Applicant: DUPONT ELECTRONICS, INC., Wilmington, DE (US)

(72) Inventors: Minfang Mu, Shanghai (CN); Dan Feng, Shanghai (CN)

(73) Assignee: DUPONT ELECTRONICS, INC., Wilmington, DE (US)

(*) Notice: Subject to any disclaimer, the term of this patent is extended or adjusted under 35 U.S.C. 154(b) by 388 days.

(21) Appl. No.: 15/505,695

(22) PCT Filed: Aug. 28, 2014

(86) PCT No.: PCT/CN2014/085379
§ 371 (c)(1),
(2) Date: Feb. 22, 2017

(87) PCT Pub. No.: WO2016/029398
PCT Pub. Date: Mar. 3, 2016

(65) Prior Publication Data
US 2017/0278989 A1    Sep. 28, 2017

(51) Int. Cl.
*H01L 31/0224* (2006.01)
*H01B 1/22* (2006.01)
*H01B 1/16* (2006.01)
*H01L 31/02* (2006.01)

(52) U.S. Cl.
CPC ....... *H01L 31/022425* (2013.01); *H01B 1/16* (2013.01); *H01B 1/22* (2013.01); *H01L 31/02008* (2013.01); *Y02E 10/50* (2013.01)

(58) Field of Classification Search
CPC .............................................. H01L 31/022425
See application file for complete search history.

(56) References Cited

U.S. PATENT DOCUMENTS

| 4,273,583 | A  | 6/1981 | Tyran |
| 4,331,714 | A  | 5/1982 | Tyran |
| 4,388,347 | A  | 6/1983 | Shum et al. |
| 5,296,413 | A  | 3/1994 | Carroll et al. |
| 5,442,145 | A  | 8/1995 | Imai et al. |
| 7,316,725 | B2 | 1/2008 | Kodas et al. |
| 7,572,314 | B2 | 8/2009 | Choi et al. |
| 8,129,088 | B2 | 3/2012 | Kuroki |
| 8,647,815 | B1 | 2/2014 | Kuroki et al. |

(Continued)

FOREIGN PATENT DOCUMENTS

| CN | 1072940 A | 6/1993 |
| CN | 1495804 A | 5/2004 |

(Continued)

OTHER PUBLICATIONS

PCT International Search Report for Application No. PCT/CN2014/085386; Chen, Junhong, Authorized Officer; ISA/CN; dated May 8, 2015.

(Continued)

*Primary Examiner* — Sadie White

(57) ABSTRACT

Disclosed herein are solar cells comprising semiconductor substrates and Cu electrodes attached thereto, wherein, the Cu electrodes are derived from conductive pastes containing powder mixtures of Cu particles and crystalline Ge particles and glass frits dispersed in organic media.

8 Claims, 2 Drawing Sheets

(56) References Cited

U.S. PATENT DOCUMENTS

| | | | |
|---|---|---|---|
| 2004/0051085 A1 | 3/2004 | Moriya | |
| 2010/0108366 A1 | 5/2010 | Kim et al. | |
| 2011/0003246 A1 | 1/2011 | Kuroki | |
| 2011/0031448 A1 | 2/2011 | Ota et al. | |
| 2011/0180137 A1 | 7/2011 | Iwamuro et al. | |
| 2011/0203659 A1 | 8/2011 | Carroll et al. | |
| 2011/0315217 A1 | 12/2011 | Gee | |
| 2012/0090882 A1 | 4/2012 | Ishimatsu et al. | |
| 2012/0240994 A1 | 9/2012 | Kim et al. | |
| 2012/0312368 A1 | 12/2012 | Hang et al. | |
| 2013/0321979 A1 | 12/2013 | Park et al. | |
| 2014/0008587 A1 | 1/2014 | Yoshida et al. | |
| 2014/0191167 A1 | 7/2014 | Huang et al. | |
| 2016/0118513 A1* | 4/2016 | Adachi ............... | H01B 1/22 136/256 |
| 2017/0275477 A1 | 9/2017 | Mu | |
| 2017/0278989 A1 | 9/2017 | Mu et al. | |
| 2017/0287587 A1 | 10/2017 | Mu et al. | |

FOREIGN PATENT DOCUMENTS

| | | | |
|---|---|---|---|
| CN | 1529918 A | 9/2004 | |
| CN | 101061243 A | 10/2007 | |
| CN | 101246759 A | 8/2008 | |
| CN | 101441904 A | 5/2009 | |
| CN | 102290453 A | 12/2011 | |
| CN | 102473563 A | 5/2012 | |
| CN | 103310870 A | 9/2013 | |
| CN | 103514975 A | 1/2014 | |
| CN | 103515480 A | 1/2014 | |
| CN | 103578561 A | 2/2014 | |
| CN | 103578651 A | 2/2014 | |
| CN | 800814239 | 3/2019 | |
| GB | 2418432 A | 3/2006 | |
| JP | 03-078906 A | 4/1991 | |
| JP | 03-176905 A | 7/1991 | |
| JP | 05-298917 A | 11/1993 | |
| JP | 08-273434 A | 10/1996 | |
| JP | 2000-048640 A | 2/2000 | |
| JP | 2001-028476 A | 1/2001 | |
| JP | 2004-002923 A | 1/2004 | |
| JP | 2004-104047 A | 4/2004 | |
| JP | 2004-156061 A | 6/2004 | |
| JP | 2004-156062 A | 6/2004 | |
| JP | 2004-162164 A | 6/2004 | |
| JP | 2004-232036 A | 8/2004 | |
| JP | 2005-136260 A | 5/2005 | |
| JP | 2006-019306 A | 1/2006 | |
| JP | 2006-225691 A | 8/2006 | |
| JP | 2006-225692 A | 8/2006 | |
| JP | 2008-138266 A | 6/2008 | |
| JP | 2008-255509 A | 10/2008 | |
| JP | 2008-270750 A | 11/2008 | |
| JP | 2009-081142 A | 4/2009 | |
| JP | 2009-135101 A | 6/2009 | |
| JP | 2009-235556 A | 10/2009 | |
| JP | 2010-013730 A | 1/2010 | |
| JP | 2010-126022 A | 6/2010 | |
| JP | 2010-196105 A | 9/2010 | |
| JP | 2011-006719 A | 1/2011 | |
| JP | 2011-006739 A | 1/2011 | |
| JP | 2011-006740 A | 1/2011 | |
| JP | 2012-076086 A | 4/2012 | |
| JP | 2012-157870 A | 8/2012 | |
| JP | 2012-179624 A | 9/2012 | |
| JP | 2012-532420 | 12/2012 | |
| JP | 2013-117053 A | 6/2013 | |
| JP | 2013-232609 A | 11/2013 | |
| JP | 2014-026953 A | 2/2014 | |
| JP | 2014-053287 A | 3/2014 | |
| JP | 2017-528871 A | 9/2017 | |
| JP | 2017-529699 A | 10/2017 | |
| JP | 2017-535024 A | 11/2017 | |
| KR | 10-2013-0065445 A | 6/2013 | |
| WO | 2012/122409 A2 | 9/2012 | |
| WO | 2013/090498 A1 | 6/2013 | |
| WO | 2013/154960 A1 | 10/2013 | |
| WO | WO-2014184856 A1 * | 11/2014 | ............... H01B 1/22 |

OTHER PUBLICATIONS

PCT International Search Report for Application No. PCT/CN2014/085379; Yang, Jia, Authorized Officer; ISA/CN; dated Dec. 16, 2014.

PCT International Search Report for Application No. PCT/CN2014/085377; Wang, Weiwei, Authorized Officer; ISN/CN; dated May 7, 2015.

* cited by examiner

SOLAR CELLS WITH COPPER ELECTRODES

FIELD OF THE INVENTION

The invention relates to solar cells containing copper electrodes.

BACKGROUND OF THE INVENTION

Precious metal powder, such as silver powder, is used in the electronics industry for the manufacture of conductive pastes. In the manufacture of solar cells, the conductive pastes are screen printed onto semiconductor substrates forming conductive patterns. These paste patterns are then dried and fired to volatilize and burn out the liquid organic medium and sinter the metal particles.

Capital investment for the furnace can be decreased because precious metals such as cold, silver, and palladium can be fired in air. Using precious metals, however, invites a sharp rise in material costs because precious metals are expensive:

Copper is widely used as a conductive component in semiconductor circuits and the like. Copper has the advantage of being less expensive than silver. However, copper cannot be fired in air because it oxidizes easily, and this increases capital investment because firing under a nitrogen atmosphere and the like is required.

Thus, in the process of forming solar cell electrodes and bus bars using conductive paste, the development of technology is needed that will satisfy the following requirements of: 1) enabling the use of inexpensive copper powder, 2) enabling firing to be performed in air, and 3) enabling low resistance in the electrodes.

BRIEF SUMMARY OF THE INVENTION

Provided herein is a solar cell comprising a semiconductor substrate end at least one copper (Cu) electrode attached to a front or back side thereof, wherein the at least one Cu electrode is formed by: (I) applying a Cu-containing conductive paste onto the front or back side of the semiconductor substrate in a predetermined shape and at a predetermined position: (U) drying the Cu-containing conductive paste; and (HI) firing the Cu-containing conductive paste to form the at least one Cu electrode, wherein, the Cu-containing conductive paste comprises: (a) about 10-95 wt % of a powder mixture of Cu and crystalline germanium (Ge) particles, and (b) about 0.1-15 wt % of a glass frit, dispersed in (c) an organic medium, with the wt % of ail components comprising in the paste totaling to 100 wt %, and wherein, (i) the powder mixture comprises about 0.01-35 parts by weight of the crystalline Ge particles, based on 100 parts by weight of the Cu particles; and (ii) the organic medium is comprised of at least one organic polymer dissolved in at least one solvent.

In one embodiment of the solar cell, the powder mixture comprises about 1-30 parts by weight of the crystalline Ge particles, based on 100 parts by weight of the Cu particles.

In a further embodiment of the solar cell, the powder mixture comprises about 3-25 parts by weight of the crystalline Ge particles, based on 100 parts by weight of the Cu particles.

In a yet further embodiment of the solar cell, the Cu particles have a particle diameter (D50) of about 1-50 µm.

In a yet further embodiment of the solar cell, the Cu particles have a particle diameter (D50) of about 1.5-30 µm.

In a yet further embodiment of the solar cell, the Cu particles have a particle diameter (D50) of about 1:5-15 µm.

In a yet further embodiment of the solar cell, the crystalline Ge particles 2.5 have a particle diameter (D50) of about 1-1000 nm.

In a yet further embodiment of the solar cell, the semiconductor substrate is selected from the group consisting of single-crystal silicons and multicrystalline silicons.

In a yet further embodiment of the solar cell, the at least one Cu electrode is formed on the front side of the semiconductor substrate and in the form of a multiple number of parallel conductive fingers and one or more front-side bus bars that are perpendicular to the conductive fingers.

In a yet further embodiment of the solar cell, the at least one Cu electrode is formed on the back side of the semiconductor substrate and in the form of one or more back-side bus bars.

DETAILED DESCRIPTION OF THE INVENTION

Figure 1:
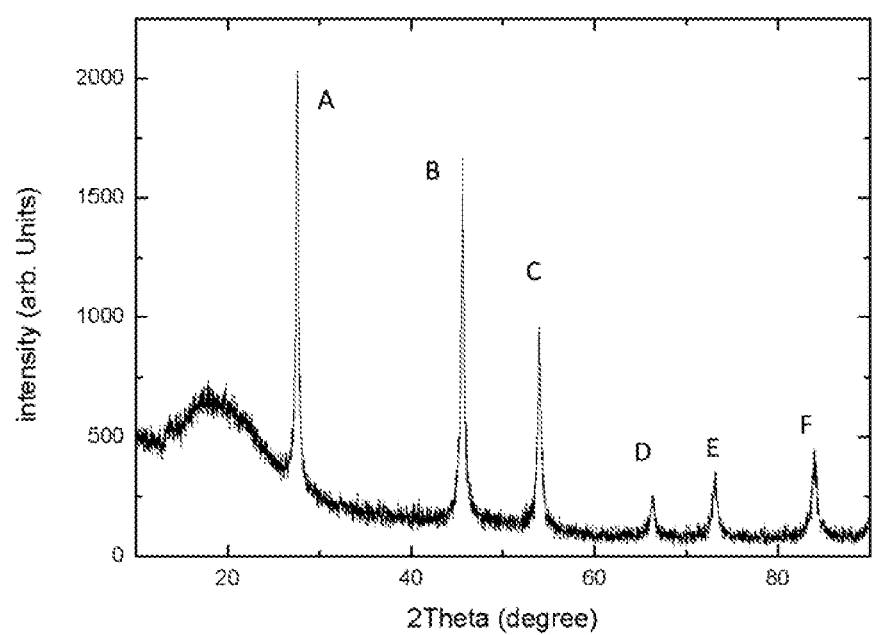
FIG. 1 is an X-ray diffraction spectrum of Ge powders.

Disclosed herein are copper-containing (Cu-containing; conductive pastes and solar cells containing semiconductor substrates with Cu electrodes formed by firing the Cu-containing conductive pastes thereon.

Cu-Containing Conductive Pastes

The Cu-containing conductive pastes disclosed herein contain inorganic powder such as a powder mixture of Cu particles and crystalline germanium (Ge) particles and glass frits dispersed into an organic medium to form the "paste", which has suitable viscosity for applying on a substrate.

The glass frit includes fusible oxides, such as glass formers, intermediate oxides, and/or modifiers. The term "fusible," as used herein, refers to the ability of a material to become fluid upon heating, such as the heating employed in a firing operation. In some embodiments, the fusible material is composed of one or more fusible subcomponents. For example, the fusible material may comprise a glass material, or a mixture of two or more glass materials. Glass material in the form of a fine powder, e.g., as the result of a comminution operation, is often termed "frit" and is readily incorporated in the present paste composition. The glass fit may be crystalline, partially crystalline, amorphous, partially amorphous or combinations thereof.

As used herein, the term "glass" refers to a particulate solid form, such as an oxide or oxyfluoride, that is at least predominantly amorphous meaning that short-range atomic order is presented in the immediate vicinity of any selected atom, that is, in the first coordination shell, but dissipates at greater atomic-level distances (i.e., there is no long-range periodic order). Hence, the X-ray diffraction pattern of a fully amorphous material exhibits broad, diffuse peaks, and not the well-defined, narrow peaks of a crystalline material. In the latter, the regular spacing of characteristic crystallographic planes gives rise to the narrow peaks, whose position in reciprocal space is in accordance with Bragg's law. A glass material also does not show a substantial crystallization exotherm upon heating close to or above its glass transition temperature or softening point, Tg, which is defined as the second transition point seen in a differential thermal analysis (DTA) scan. In an embodiment, the softening point of glass material used in the present paste composition is in the range of 300 to 800° C.

It is also contemplated that some or all of the oxides in glass frits may be composed of material that exhibits some degree of crystallinity. For example, in some embodiments, a plurality of oxides are melted together, resulting in a material that is partially amorphous and partially crystalline. As would be recognized by a skilled person, such a material would produce an X-ray diffraction pattern having narrow, crystalline peaks superimposed on a pattern with broad, diffuse peaks. Alternatively, one or more constituents, or even substantially all of the fusible material, may be predominantly or even substantially fully crystalline. In an embodiment, crystalline material useful in the fusible material of the present paste composition may have a melting point of at most 800° C.

In particular, the Cu-containing conductive paste disclosed herein comprises (i) a powder mixture of Cu particles and crystalline Ge particles and (ii) a glass frit, dispersed in (iii) an organic medium. And the paste has suitable viscosity for applying on a substrate. The viscosity of the Cu-containing conductive paste may be about 0.05-5000 Pa·s at shear rate between about 0.2-350 in certain embodiments, a viscosity of 5-800 Pa·s is preferred when screen printing is employed.

(i) Powder Mixtures of Cu Particles and Crystalline Ge Particles

The Cu particles used herein can be pure Cu, or a Cu alloy with nickel, silver, aluminum, zinc, tin, silicon, iron, manganese, germanium, boron, or mixtures thereof. Among them, Cu alloys with zinc, tin, aluminum, silicon, or mixtures thereof are preferred. The pure Cu can have purity of at least about 80% Cu in one embodiment, at least about 90% Cu in another embodiment, or at least about 95% Cu in yet another embodiment.

A skilled person would recognize that the choice of raw materials could unintentionally include impurities that may be incorporated into the Cu during processing. For example, the impurities may be present in the range of hundreds to thousands of parts per million. Impurities commonly occurring in industrial metals used herein are known to one of ordinary skill.

Particle diameter (D50) of the Cu particles can be about 1-50 μm in one embodiment, about 1.5-30 μm in another embodiment, or about 1.5-15 μm in yet another embodiment. As used herein, "particle diameter (D50)" is intended to mean the 50% volume distribution size. The particle diameter (D50) may be obtained by measuring the distribution of the particle diameters using light scattering methods following, for example, ASTM B822-10.

The Cu particles used herein may be of any shape. For example, they can be spherical, flaky, or irregular in shape.

The inclusion of the crystalline Ge particles in the powder mixture reduces oxidation of the Cu particles during firing in air. The increase in electrode resistivity resulting from Cu oxidation can be reduced or inhibited by the addition of the crystalline Ge particles.

Particle diameter (D50) of the crystalline Ge particles used herein may be about 1-1000 nm in one embodiment, about 5-500 nm in another embodiment, or about 10-300 nm in yet another embodiments. The particle diameter (D50) can be obtained by measuring the distribution of the particle diameters using light scattering methods following, for example, ASTM E2490-09. And the crystalline Ge particles may be present in the powder mixture at a level of about 0.01-35 parts by weight, or about 1-30 parts by weight, or about 3-25 parts by weight, based on 100 parts by weight of the Cu particles.

The powder mixture of Cu particles and crystalline Ge particles may be present in the Cu-containing conductive paste at a level of about 10-95 wt %, or about 40-95 wt %, about 60-95 wt %, based on the total weight of the Cu-containing conductive paste. The powder mixture in the above range dives the electrode sufficient conductivity.

Besides the powder mixture of Cu particles and crystalline Ge particles, any other additional metal powder can be added to the Cu-containing conductive paste. A powder of silver (Ag), gold (Au), palladium (Pd), aluminum (Al), platinum (Pt), nickel (Ni), tin (Sn) or mixtures or alloys of two or more of these metals can, for example, be added to the Cu-containing paste. In one embodiment, the Cu-containing conductive paste may include one or more of the following: Ag, Pt, Al, Ni, alloys of Ag and Pd, and alloys of Pt and Au, and such additional metals may be present in the Cu-containing conductive paste at a total content level of up to about 60 wt %, based on the total weight of the paste.

(ii) Glass Frit

Glass frit functions to help with sintering of the conductive powder and to increase the adhesion of the electrode to the substrate. Complex oxides that could behave just like the glass frit in the firing also can be considered as the glass frit.

The glass frit used herein may be included in the Cu-containing conductive paste at a level of about 0.1-15 wt %, or about 0.2-10 wt %, or about 0.5-8 wt %, based on the total weight of the paste. With such amount, the glass frit can serve the function above. Particle diameter (D50) of the glass frit in the paste can be about 0.1-10 μm in one embodiment, about 0.3-6 μm in another embodiment, or about 0.6-4 μm in yet another embodiment. A uniformed dispersion of glass frit within the paste can be obtained when part diameter (D50) of the glass frit is maintained within the disclosed range. The glass frit particle diameter (D50) can be measured in the same way as for the Cu particles described above.

The chemical composition of the glass frit used herein is not limited. Any glass frits can be suitable for use in the Cu-containing conductive paste. For example, a lead-boron-silicon glass frit or a lead-free bismuth glass frit like the bismuth-based oxide compositions disclosed in Table 1 of US 201210312368 can be used herein. The softening point of the glass frit can be about 300-800° C. When the softening point is in the referenced range, the glass frit melts properly to obtain the effects mentioned above. The softening point can be determined by differential thermal analysis (DTA).

(iii) Organic Medium

The inorganic powders such as the powder mixture of Cu particles and crystalline Ge particles and the glass frit are dispersed into the organic medium to form a viscous composition called "paste", having suitable viscosity for applying on a substrate with a desired pattern. Suitable organic media should have rheological properties that provide a stable dispersion of solids, appropriate viscosity and thixotropy for applying the paste to a substrate, appropriate wettability on the substrate and the paste solids, good drying rate, and good firing properties.

There is no restriction on the composition of the organic medium used herein. The organic medium used herein may be a solution comprised of at least one organic polymer dissolved in at least one so vent.

A wide variety of organic polymers can be used herein, for example, sugar, starch, cellulose, wood rosin, epoxy resin, phenolic resin, acrylic resin, polyacrylates, polyesters, polylactones, phenoxy resins, or a mixture of two or more thereof. Of these, celluloses are preferred, which include, without limitation, ethyl cellulose, cellulose nitrate, hydroxyethyl cellulose, ethylhydroxyethyl cellulose, carboxymethyl cellulose, hydroxypropyl cellulose, and mixtures and derivatives thereof.

Suitable solvents may include, without limitation, terpenes (e.g., alpha- or beta-terpineol), kerosene, dibutylphthalate, butyl carbitol, butyl carbitol acetate, hexylene glycol, alcohols with boiling points above 150° C., alcohol esters, bis(2-(2-butoxyethoxy)ethyl adipate dibasic esters, octyl epoxy tallate, isotetradecanol, pentaerythritol ester of hydrogenated rosin, and mixtures thereof. The solvents can also include volatile liquids to promote rapid hardening after application of the paste on a substrate.

The organic medium may further contain thickeners, stabilizers, surfactants, and/or other common additives to improve the performance of the paste, such as printability, dispersion, and/or stability.

The optimal amount of the organic medium in the Cu-containing conductive paste is dependent on the method of applying, the paste and the specific organic medium used. Typically, the Cu-containing conductive paste disclosed herein may contain about 3-70 wt %; or about 3-65 wt %, or about 3-58 wt % of the organic medium, based on the total weight of the paste.

(iv) Additional Inorganic Powder

Additional inorganic powder can be optionally added to the Cu-containing conductive paste. The additional inorganic powder is not essential. However, the additional inorganic powder can improve various properties of the electrode, such as adhesion and conductivity.

In one embodiment, the additional inorganic powders used herein may be selected from metals, metal oxides, or mixtures thereof. Exemplary metals used herein may be selected from Zn, Gd, Ce, Zr, Ti, Sn, Ru, Co, Fe, Cr, or mixtures of two or more thereof. Exemplary metal oxides used herein may be one or more oxides of Zn, Gd, Ce, Zr, Ti, Mn, Sn, Ru, Co, Fe, or Cr. The metal oxides used herein also include any compounds that can generate the metal oxides, as described above, upon firing.

The additional inorganic: powder can be present in the Cu-containing conductive paste at a level of about 0.05-10 wt % in one embodiment, about 0.1-7 wt % in another embodiment, or about 0.2-6 wt % in yet another embodiment, based on the total weight of the paste.

The particle diameter (D50) of the additional inorganic powder is not subject to any particular limitation, although an average particle size of no more than about 10 μm, and preferably no more than about 5 μm, is desirable.

The Cu-containing conductive paste disclosed herein may be formed by any suitable mixing process. For example, the paste may be prepared by simply mixing and dispersing the Cu particles, the crystalline Ge particles, the glass frits, and the optional other inorganic particles in the organic medium.

Solar Cells

Further disclosed herein are solar cells containing semiconductor substrates with Cu electrodes, wherein the Cu electrodes are formed by, first, applying (e.g., dispensing, casting, coating, or printing) the Cu-containing conductive paste (as disclosed above) onto the surface of a semiconductor substrate in a predetermined shape and at a predetermined position, drying the Cu-containing conductive paste at an elevated temperature (e.g., about 70-240° C.) for a certain duration (e.g., about 2-20 min) to partially remove the organic medium, and then, firing the Cu-containing conductive paste to remove the residual organic medium and sinter the powder mixture of Cu particles and crystalline Ge particles with the glass frit and the other inorganic materials comprising the paste.

The way of applying the Cu-containing conductive paste on the substrate is not limited and any suitable process can be used herein. Exemplary application processes useful herein include, without limitation, dispensing, screen printing, ink jet printing, casting, spraying, gravure printing, flexo printing, stencil printing, nozzle dispensing, syringe dispensing, plating, extrusion, multiple printing, or offset printing, direct writing, and the like. In particular, screen printing is often used as it can apply the Cu-containing conductive paste on the substrate in a relatively short time. The pattern of the Cu-containing conductive paste on the substrate can be any desired electrode pattern such as line(s), circle, or square.

The Cu-containing conductive paste that is applied over the substrate can be optionally dried for, for example, about 2-20 minutes at about 70° C.-250° C. in an oven. The drying process may be carried out at a modest temperature to harden the paste by removing its most volatile organics.

The Cu-containing conductive paste on the substrate is then fired in any atmosphere. A furnace set with a predetermined temperature and time profile can be used.

The powder mixture of Cu particles and crystalline Ge particles sinters during firing to become the electrode that has a sufficient conductivity. The organic medium could be removed by being burned off or carbonized during firing.

Firing may be carried out in an atmosphere composed of nitrogen, argon, or any other inert gas, or an oxygen-containing mixture such as air, or a mixed gas of oxygen and nitrogen. In one embodiment of the present disclosure, the Cu-containing conductive paste on the substrate is fired in air. The term, "firing in air" or "air firing", essentially refers to firing without replacing the atmosphere in the firing space with a gas containing no oxygen or less oxygen than the surrounding atmosphere around the firing space. In an embodiment, the air surrounding the firing equipment is used as the firing atmosphere without replacing the firing atmosphere with other gas.

The firing condition can vary depending on substrate type, properties of the Cu-containing conductive paste, or the pattern of the Cu-containing conductive paste on the substrate. However, the electrode can be generally obtained by firing the Cu-containing conductive paste at a setting peak temperature of about 500-1200° C. and for a firing time of about 5 seconds to about 30 min. The setting peak temperature can be about 500-1100° C. in one embodiment, or about 550-1000° C. in another embodiment. The firing time can be about 10 seconds to about 20 min in one embodiment, or about 30 seconds to about 10 min in another embodiment. The firing condition can be adjusted by taking into consideration the firing temperature and the firing time. For example, the Cu-containing conductive paste can be fired at a high temperature for a short time or low temperature for a long time when the substrate is easily damaged by the high temperature.

In an embodiment, the firing is accomplished by passing the substrate bearing the printed paste pattern through a belt furnace at high transport rates, for example between about 2.5-760 cm/min, with firing time between about 10 seconds and about 3 hours. The firing time employed herein is the time from starting to ending of firing. In certain embodiments, the paste-bearing substrate are first dried before entering a belt furnace, fired while passing through the belt furnace, and then cooled down after exiting the belt furnace. In such embodiments, the firing time is the time from the entrance to the exit of the furnace. Multiple temperature zones may be set for the belt furnace to control the desired thermal profile, and the number of zones may vary, for example, between 3 to 11 zones. The firing temperature in a belt furnace is conventionally specified by the furnace set point in the hottest zone of the furnace, but it is known that the peak temperature attained by the passing substrate in such a process is somewhat lower than the highest set point. Other batch and continuous rapid fire furnace designs known to one of skill in the art are also contemplated.

Electrodes are formed over the substrates after the firing. The average width of the electrode can be about 10 µm to 10 mm in one embodiment, about 30 µm to 7 mm in another embodiment, or about 50 µm to 5 mm in yet another embodiment, and the average thickness can be about 1-200 µm in one embodiment, about 1-100 µm in another embodiment, or about 1-50 µm in yet another embodiment.

As demonstrated by the below examples, by replacing the move expensive Ag particles with the less expensive powder mixtures of Cu particles and crystalline Ge particles m the conductive paste, not only is the material cost very much reduced, but the paste can be fired in air and electrodes as so obtained possess low resistivity. This is very desirable when it is used in forming electrodes for solar cells.

The semiconductor substrates comprised in the solar cells include, without limitation, single-crystal silicon, multicrystalline silicon, and the like.

The semiconductor substrates used herein may be doped with phosphorus and boron to form a p/n junction. The semiconductor substrates also vary in size (length×width) and thickness. As an example, the thickness of the semiconductor substrate used herein may be about 50-500 µm, about 100-300 µm, or about 140-200 µm. The length and width of the semiconductor substrate may each be about 100-250 mm, about 125-200 mm, or about 125-155 mm.

Figure 2A:
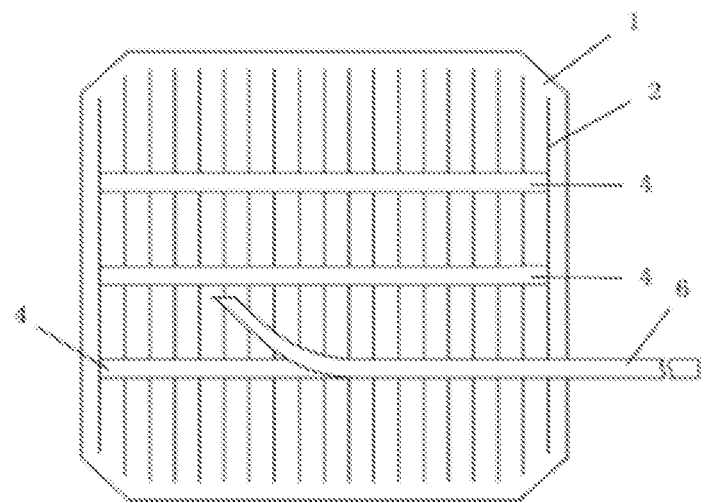
FIG. 2(a) is a planar view of the front surface of a solar cell.
Figure 2B:
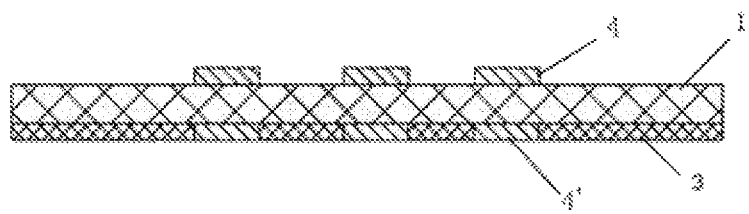
FIGS. 2(b) and 2(c) are cross-sectional views of solar cells with different designs of back-side electrodes.
Figure 2C:
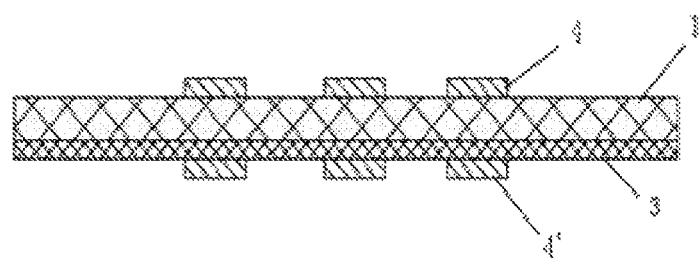

The semiconductor substrates of solar cells typically have a front side end a back side, wherein the front side of the semiconductor substrates faces to a light source when in use. And the Cu-containing conductive paste disclosed herein can be used herein to form the Cu electrodes on the front and/or back sides of the semiconductor substrates. And as illustrated in FIGS. 2(a)-2(c), the front-side electrodes may be formed of a multiple number of parallel conductive fingers (2) and one or more front-side bus bars (4) that are perpendicular to the conductive fingers (2), while the back side electrodes are formed of at least one back-side bus bar (4') and Al paste (3). The back side bus, bars (4') are also called tabbings and are typically positioned in the mirror positions of the front-side bus bars (4).

Typically, an anti-reflection coating and/or insulation coating may be formed on the front side of the semiconductor substrate of the solar cell. Exemplary anti-refection coating or insulation coating materials used herein, include without limitation, silicon nitride, silicon oxide, titanium oxide, SiNx:H, hydrogenated amorphous silicon nitride, and silicon oxide/titanium oxide. The coating can be formed by plasma enhanced chemical vapor deposition (PECVD), CVD, and/or other known techniques known. Therefore, when preparing the front-side electrodes on the semiconductor substrate, the Cu-containing conductive paste disclosed herein is applied over the anti-reflective coating and/or insulation coating on the semiconductor substrate, by a variety of methods as described above, in a predetermined pattern and shape and at a predetermined position.

In one embodiment, the front-side bus bar(s) (4) of the semiconductor substrate are formed of the Cu electrodes disclosed herein. The front-side bus bars (4) may be in the form of continuous or discontinuous lines across the front surface. And the front-side bus bars (4) may have a width of about 0.5-4 mm or about 1-2 mm and a thickness of about 2-40 µm, about 2-30 µm, or about 3-20 µm. In addition, the front-side conductive fingers (2) also may be formed of the Cu electrodes disclosed herein. And each of the conductive fingers (2) may have a width of about 20-200 µm, about 30-160 µm, or about 30-100 µm and a thickness of about 3-100 µm, about 3-50 µm, or about 5-30 µm, in forming the front-side bus bar(s) (4) and/or conductive fingers (2), the Cu-containing conductive paste disclosed herein is first applied (e.g., screen printed) over the front surface of the semiconductor substrate in a predetermined pattern, shape, and position that corresponds to the front-side bus bars (4) and/or conductive fingers (2) of the semiconductor substrate, and then dried, for example, for about 0.5-10 min, during which time the volatile solvents of the organic medium are removed, or partially removed. The dried paste is then fired by heating to a maximum temperature of about 500° C.-1000° C. for about 1 sec to 2 min. The firing may be carried out in any atmosphere, preferably, in air. During firing, the glass frit in the fired Cu electrodes (e.g., the conductive fingers and front-side bus bars) react with the anti-reflective coating and/or insulation coating, thereby making electrical contact and/or mechanical adhesion with the semiconductor substrate.

In addition, the Cu-containing conductive paste may be used in forming the back-side bus bars (4') of the semiconductor substrate of the solar cell. The back-side bus bar(s) (4') also may be in the form of continuous or discontinuous lines across the back surface. And the backside bus bars (4') may have a width of about 0.5-5 mm or about 1-4 mm and a thickness of about 2-40 µm, about 2-30 µm, or about 3-20 µm. The Cu-Containing conductive paste disclosed herein is applied over the back side of the semiconductor substrate in a predetermined pattern and shape, and at a predetermined position. The predetermined pattern, shape, and position correspond to the back-side bus bars (4') of the semiconductor substrate. In one embodiment, other conductive materials containing aluminum or aluminum and silver are applied over the back surface of the semiconductor substrate, which is not covered by the Cu-containing conductive paste (corresponding to the Al paste (3) in FIG. 2(b)). While in other embodiments, other conductive materials containing aluminum or aluminum and silver are applied over the entire back surface of the semiconductor substrate prior to the application of the Cu-containing conductive paste (corresponding to the Al paste (3) in FIG. 2(c)). In such embodiments, the Cu-containing conductive paste is applied over the coating formed of the other conductive materials. Thereafter, the paste bearing semiconductor substrate is subject to firing in any atmosphere, preferably, in air, to form the back-side electrodes.

In practice, the front electrodes and the back electrodes of the semiconductor substrate may be formed sequentially or simultaneously. When the front electrodes and back electrodes are formed simultaneously, conductive pastes are first applied and dried over a first side of the substrate, then conductive pastes are applied and dried over a second side of the substrate, and finally, the paste bearing substrate is fired in any suitable atmosphere, or preferably in air. Cu electrodes may thus be formed on both sides of the semiconductor substrates.

EXAMPLE

Inorganic Powders:

The following inorganic powders were used in these examples.

Cu: copper (Cu) powders (with particle diameter (D50) of 0.78 µm, 3.6 µm, 5.4 µm, or 8.3 µm) purchased from Mitsui Mining & Smelting Co., Ltd. (Japan);

Ge: crystalline germanium (Ge) nanoparticles (particle diameter (D50)=70-120 nm) and purchased from Foreman Scientific (Beijing) Co., Ltd. (China).

Crystalline Ge Particles

Using a plastic tape, 0.5 gram of the crystalline Ge particles were wrapped into a roll and the X-ray diffraction patterns thereof were recorded on an X-ray diffractometer (manufactured by Bruker Corporation (Germany) with the model name D8 Advance) in the range of 10-90°. As shown in FIG. 1, 6 sharp peaks (A, B, C, D, E, and F) were observed on the X-ray diffraction spectrum, which corresponded to planes (111), (220), (311), (400), (331), (422), respectively. This suggests that the Ge particles were highly crystallized.

COMPARATIVE EXAMPLE CE1 AND EXAMPLES E1-E5

In each of CE1 and E1-E5, a thick film paste was prepared as follows: 8.3 g Cu particles (CE1) or a powder mixture of Cu and crystalline Ge particle (E1-E5 as listed in Table 1), 0.29 g Bi—Zn—B—Al—Ba—Si oxide glass frit similar to the bismuth-based oxide compositions disclosed in Table 1 of US 2012/10312368 (with D50 of 0.8 µm), 0.02 g hydrogenated castor oil, 1.1 g a solution comprised of 10-20 wt % ethyl cellulose dissolved in terpineol, and 0.29 g 2,2,4-trimethyl-1,3-pentanediol monoisobutyrate were mixed in a mixer (manufactured by Thinky USA Inc. (U.S.A.) with the mode name ARE-310) at 2000 rpm for 1 min, followed by grinding for 6 min by hand.

In each sample, and using a stencil, the thick film paste prepared above was cast on the surface of a silicon substrate (silicon nitride coated 6" silicon wafer (180 µm thick) obtained from JA Solar Holdings Co. Ltd) to form a 30 µm thick line of paste layer (2 mm wide and 30 mm long). The paste layer was then dried at 100° C. for 6-10 min. The dried paste was fired in air using an IR furnace (manufactured by Despatch Instruments (P. R. C.) with the model name CF-7210). The temperature profile of the IR furnace was set at 580-610-630-650-820-900° C. and the bit speed was at about 560 cm/min. Electrodes on the silicon cell were then obtained.

The sheet resistance of the electrode on the surface of the silicon cell was measured by a four-probe method using a sheet resistivity meter (manufactured by Napson Corp. (Japan) with the model name RT3000/RG7) and the thickness of the electrode was measured using a Veeco Surface Profiler (manufactured by Veeco Instruments Inc. with the model name Dektak 150). The resistivity of the electrode was calculated by the equation below and tabulated in Table 1:

$$\rho(\text{Resistivity}) = \text{sheet resistance} \times \text{thickness} \times \text{geometry correction}$$

$$= \text{sheet resistance} \times \text{thickness} \times 1.9475/4.5324$$

The results demonstrate that when Cu particles were used in the thick film paste (CE1), the electrodes prepared therefrom had very high resistivity. However, it was found that when crystalline Ge particles were added in the thick film paste, in addition to the Cu particles (E1-E5), the resistivities of the electrodes prepared from such thick film pastes were decreased dramatically. Such effects were more evident when the particle diameter (D50) of Cu particles was maintained at 1 µm or larger.

TABLE 1

| Samples | Inorganic Powder | | Resistivity |
|---|---|---|---|
| | Weight ratio | D50 of Cu (µm) | (ohm-cm) |
| CE1 | Cu | 5.4 | 9.37E+02 |
| E1 | Cu:Ge (100:5) | 0.78 | 3.60E+02 |
| E2 | Cu:Ge (100:5) | 3.6 | 1.08E−04 |
| E3 | Cu:Ge (100:5) | 5.4 | 3.37E−05 |
| E4 | Cu:Ge (100:8) | 5.4 | 3.30E−05 |
| E5 | Cu:Ge (100:5) | 8.3 | 5.24E−05 |

EXAMPLES E6-E11

In the same way as described for E1, in each of E6-E11, a thick film paste was prepared and the thick film paste as so prepared was fired over a silicon substrate of E1 to form an electrode. In these examples, Cu particles with particle diameters (D50) of 5.4 µm were used. During the firing process, the temperature profile was set at 580-610-630-650-700-700° C. and the belt speed was set at 127 cm/min or 280 cm/min. The resistivities of the electrodes were determined and tabulated in Table 2. Here again, it is demonstrated that when crystalline Ge particles were added in the thick film paste, in addition to the Cu particles (E6-E11), the resistivities of the electrodes prepared from such thick film pastes were decreased dramatically, compared to those pastes comprising Cu particles only.

TABLE 2

| | | Resistivity (ohm-cm) | |
|---|---|---|---|
| Samples | Inorganic Powders (weight ratio) | Belt Speed @ 127 cm/min | Belt Speed @ 280 cm/min |
| CE2 | Cu | 8.50E+03 | 6.25E+03 |
| E6 | Cu:Ge (100:2) | 2.99E+03 | 8.61E−04 |
| E7 | Cu:Ge (100:4) | 3.71E−03 | 2.05E−04 |
| E8 | Cu:Ge (100:6) | 1.55E−04 | 1.27E−04 |
| E9 | Cu:Ge (100:8) | 5.23E−05 | 9.13E−05 |
| E10 | Cu:Ge (100:11) | 8.43E−05 | 8.75E−05 |
| E11 | Cu:Ge (100:20) | 6.53E−05 | 6.25E−05 |

EXAMPLES E12 AND E13

FIG. 2 illustrates a solar cell with electrodes: FIG. 2(a) shows the front surface of a solar cell (1). The front electrodes of the solar cell (1) are formed a multiple number of fingers (2) that are parallel to each other and three front-side bus bars (4) that are perpendicular to the fingers (2). In addition, ribbons (6) can be later electrically bonded (e.g. soldered) over the bus bars (4). FIG. 2(b) is a cross-sectional view of the solar cell (1) with electrodes. As shown in FIG. 2(b), the back electrodes are formed of three back side bus bars (4') which are in mirror position of the front-side bus bars (4) and an Al paste (3) cover the entire area of the back surface of the solar cell (1) (except the areas that are covered by the three back-side bus bars (4').

For each of E12 and E13, a Cu-containing conductive paste is prepared as follows: 150 g powder mixture of Cu and Ge at a weight ratio of 100:5, 6 g glass frit similar to the bismuth-based oxide compositions disclosed in Table 1 of US 2012/0312368, 1 g hydrogenated castor oil, 0.2 g caprylic acid, and 42.8 g a solution comprised of 10-20 wt % ethyl cellulose dissolved in terpineol are mixed in a mixer at 2000 rpm for 1 min; and the final Cu-containing conductive paste is obtained by passing the mixture through a three-roller machine (manufactured by EXAKT Technologies, Inc. with the model name EXAKT 50) twice.

In E12 (as in FIG. 2(b), a silicon cell with front-side and back-side electrodes is prepared as follows. First, DuPont™ Solamet® PV17F photovoltaic metallization front side silver paste (obtained from E.I. du Pont de Nemours and Company (U.S.A.), hereafter "DuPont") is screen printed over the front surface of the silicon cell in the position of conductive fingers (2) and front-side bus bars (4), followed by drying at 240° C. for 3 min. Then, the Cu-containing conductive paste as prepared above is screen printed over the back surface of the silicon cell in the position of back-side bus bars (4'), followed by drying at 240° C. for 3 min, and Al paste PV35A (obtained from DuPont) was screen printed over the backside of the silicon cell (except the area that were covered by the back-side bus bars (4')), followed by drying at 240° C. for 3 min. Finally, the silicon cell is fired in air using an IR furnace. The temperature profile of the IR furnace is set at 580-610-630-650-800-900° C. and the belt speed is at 560 cm/min.

In E13 (as shown in FIG. 1(c)), a silicon cell with front-side and back-side electrodes is prepared as follows. First, DuPont™ Solamet® PV17F photovoltaic metallization front side silver paste is screen printed over the front surface of the silicon cell in the position of fingers (2) and front-side bus bars (4), followed by drying at 240° C. for 3 min. The Cu-containing conductive paste as prepared above is screen printed in the position of the back-side bus bars (4'), followed by drying at 240° C. for 3 min. And Al paste PV35A is screen printed over the entire surface of the backside of the silicon cell (except the area that is covered by the Cu-containing conductive paste), followed by drying at 240° C. for 3 min. Finally, the silicon cell is fired in air using an IR furnace. Again, the temperature profile of the IR furnace is set at 580-610-610-650-800-900° C. and the belt speed is at 660 cm/min.

What is claimed is:

1. A solar cell comprising a semiconductor substrate and at least one copper (Cu) electrode attached to a front or back side thereof,
wherein the at least one Cu electrode is formed by: (I) applying a Cu-containing conductive paste onto the front or back side of the semiconductor substrate in a predetermined shape and at a predetermined position; (II) drying the Cu-containing conductive paste; and (III) firing the Cu-containing conductive paste to form the at least one Cu electrode,
wherein, the Cu-containing conductive paste comprises:
   a) about 10-95 wt % of a powder mixture of Cu particles and crystalline germanium (Ge) particles, and
   b) about 0.1-15 wt % of a glass frit, dispersed in
   c) an organic medium,
with the total wt % of all components comprising in the paste totaling to 100 wt %, and wherein, (i) the powder mixture comprises about 3-25 parts by weight of the crystalline Ge particles, based on 100 parts by weight of the Cu particles; and (ii) the organic medium is comprised of at least one organic polymer dissolved in at least one solvent.

2. The solar cell of claim 1, wherein, the Cu particles have a particle diameter (D50) of about 1-50 µm.

3. The solar cell of claim 2, wherein, the Cu particles have a particle diameter (D50) of about 1.5-30 µm.

4. The solar cell of claim 3, wherein, the Cu particles have a particle diameter (D50) of about 1.5-15 µm.

5. The solar cell of claim 1, wherein, the crystalline Ge particles have a particle diameter (D50) of about 1-1000 nm.

6. The solar cell of claim 1, wherein the semiconductor substrate is selected from the group consisting of single-crystal silicons and multicrystalline silicons.

7. The solar cell of claim 1, wherein, the at least one Cu electrode is formed on the front side of the semiconductor substrate and in the form of a multiple number of parallel conductive fingers and one or more front-side bus bars that are perpendicular to the conductive fingers.

8. The solar cell of claim 1, wherein, the at least one Cu electrode is formed on the back side of the semiconductor substrate and in the form of one or more back-side bus bars.

* * * * *